(12) United States Patent
Brugger et al.

(10) Patent No.: US 12,538,752 B2
(45) Date of Patent: Jan. 27, 2026

(54) APPARATUS FOR PROCESSING A WAFER-SHAPED ARTICLE

(71) Applicant: LAM RESEARCH AG, Villach (AT)

(72) Inventors: Michael Brugger, Millstatt (AT);
Burkhart Schier, Klagenfurt (AT);
Michael Duller, Treffen (AT)

(73) Assignee: LAM RESEARCH AG, Villach (AT)

( * ) Notice: Subject to any disclaimer, the term of this patent is extended or adjusted under 35 U.S.C. 154(b) by 295 days.

(21) Appl. No.: 18/019,653

(22) PCT Filed: Apr. 7, 2021

(86) PCT No.: PCT/EP2021/059023
§ 371 (c)(1),
(2) Date: Feb. 6, 2023

(87) PCT Pub. No.: WO2022/033729
PCT Pub. Date: Feb. 17, 2022

(65) Prior Publication Data
US 2023/0298928 A1    Sep. 21, 2023

(30) Foreign Application Priority Data
Aug. 14, 2020   (GB) ..................................... 2012725

(51) Int. Cl.
*H01L 21/687*   (2006.01)
*H01L 21/67*   (2006.01)

(52) U.S. Cl.
CPC .. *H01L 21/68728* (2013.01); *H01L 21/67126* (2013.01)

(58) Field of Classification Search
CPC ......... H01L 21/68721; H01L 21/68785; H01L 21/68728; H01L 21/68792
See application file for complete search history.

(56) References Cited

U.S. PATENT DOCUMENTS

| 4,903,717 A | 2/1990 | Sumnitsch |
| 5,513,668 A | 5/1996 | Sumnitsch |
| (Continued) | | |

FOREIGN PATENT DOCUMENTS

| KR | 1020080060784 A | 7/2008 |
| KR | 1020090118672 A | 11/2009 |
| (Continued) | | |

OTHER PUBLICATIONS

International Search Report and Written Opinion of the ISA issued in PCT/EP2021/059023, mailed Jun. 17, 2021; ISA/EP.

(Continued)

*Primary Examiner* — Kaitlin S Joerger

(57) ABSTRACT

Apparatus for processing a wafer-shaped article, the apparatus comprising a support configured to support the wafer-shaped article during a processing operation; wherein: the support comprises a support body and a plurality of gripping pin assemblies adapted and positioned relative to the support body for gripping the wafer-shaped article, wherein each of the gripping pin assemblies is rotatable relative to the support body between a gripping configuration in which the gripping pin assemblies grip the wafer-shaped article, and a non-gripping configuration in which the gripping pin assemblies do not grip the wafer-shaped article; each of the gripping pin assemblies protrudes from a respective hole in the support body; and a sealing member is positioned between at least one of the gripping pin assemblies and the respective hole, the sealing member being configured to restrict infiltration of a processing liquid used in the processing operation into the hole.

18 Claims, 4 Drawing Sheets

(56) References Cited

U.S. PATENT DOCUMENTS

| | | | |
|---|---|---|---|
| 6,435,200 B1 | 8/2002 | Langen | |
| 8,608,146 B2 | 12/2013 | Brugger et al. | |
| 9,190,210 B2 | 11/2015 | Koizumi | |
| 9,190,310 B2* | 11/2015 | Brugger | ............ H01L 21/68792 |
| 2007/0089767 A1* | 4/2007 | Yamamoto | ................ B08B 3/02 |
| | | | 134/137 |
| 2007/0207706 A1 | 9/2007 | Takahashi | |
| 2008/0189975 A1 | 8/2008 | Miya | |
| 2011/0146728 A1* | 6/2011 | Brugger | .............. H01L 21/6875 |
| | | | 134/32 |
| 2011/0148022 A1* | 6/2011 | Brugger | ............ H01L 21/68757 |
| | | | 269/296 |
| 2011/0236162 A1* | 9/2011 | Shikayama | ....... H01L 21/68742 |
| | | | 414/222.01 |
| 2011/0254236 A1* | 10/2011 | Brugger | ............ H01L 21/68792 |
| | | | 279/125 |
| 2013/0154203 A1* | 6/2013 | Tschinderle | ...... H01L 21/68785 |
| | | | 279/33 |
| 2015/0200123 A1 | 7/2015 | Brugger et al. | |
| 2017/0256433 A1* | 9/2017 | Hammer | ........... H01L 21/67051 |
| 2017/0345684 A1* | 11/2017 | Hohenwarter | .... H01L 21/67115 |
| 2018/0040502 A1* | 2/2018 | Kon | .................. H01L 21/67115 |
| 2020/0144085 A1* | 5/2020 | Suzuki | ................ H01L 21/6831 |
| 2022/0102188 A1* | 3/2022 | Tang | .................. H01L 21/68792 |
| 2022/0170147 A1* | 6/2022 | Tonai | ..................... C23C 14/351 |
| 2023/0061423 A1* | 3/2023 | Taguchi | ................ C23C 14/505 |

FOREIGN PATENT DOCUMENTS

| | | |
|---|---|---|
| KR | 20100001152 U | 2/2010 |
| KR | 200465821 Y1 * | 3/2013 |
| KR | 20150076132 A | 7/2015 |
| TW | 201513250 A | 4/2015 |

OTHER PUBLICATIONS

GB Search Report of the Intellectual Property Office issued in Application No. GB 2012725.4, dated Jan. 11, 2021.

Office Action issued in corresponding Korean App. No. 10-2023-7008745 dated Jan. 24, 2025.

Office Action issued in corresponding Taiwanese App. No. 110129595 dated Apr. 30, 2025.

* cited by examiner

APPARATUS FOR PROCESSING A WAFER-SHAPED ARTICLE

CROSS-REFERENCE TO RELATED APPLICATIONS

This application is a U.S. National Phase Application under 35 U.S.C. 371 of International Application No. PCT/EP2021/059023, filed on Apr. 7, 2021, which claims the benefit of Great Britain Patent Application No. GB 2012725.4, filed on Aug. 14, 2020. The entire disclosures of the applications referenced above are incorporated herein by reference.

FIELD OF THE INVENTION

The present invention relates to an apparatus for processing a wafer-shaped article, such as a semiconductor wafer, and to a gripping pin assembly for use in an apparatus for processing a wafer-shaped article.

BACKGROUND OF THE INVENTION

Apparatus for processing wafer-shaped articles often include pins that support the wafer-shaped articles, either from below or laterally about the edge of the wafer-shaped article.

Examples of such devices are described in the commonly owned U.S. Pat. Nos. 4,903,717; 5,513,668; 6,435,200; 8,608,146 and 9,190,210, the contents of which are hereby expressly incorporated by reference in their entirety.

In a known apparatus for processing wafer-shaped articles, for example that described in U.S. Pat. No. 9,190,310, the apparatus comprises a chuck for receiving and supporting a wafer-shaped article that is to be subjected to a processing operation.

The chuck comprises a chuck body and a plurality of pin assemblies. Each of the pin assemblies is partly (mainly) positioned in a hole in the chuck body, and comprises a main body, a first gear at a first end of the main body, and an eccentric longitudinal protrusion at a second end of the main body. At least the eccentric longitudinal protrusion protrudes from the chuck body so as to contact and support a wafer received by the chuck.

The pin assemblies are positioned in a circular series surrounding an area where the wafer-shaped article is to be positioned on the chuck.

A second gear is provided in the chuck body that is meshed with each of the first gears of the pin assemblies, such that rotation of the second gear causes synchronised rotation of the first gears, and therefore synchronised rotation of the pin assemblies.

The second gear is coupled to an electric motor via a rotor shaft, such that the second gear can be driven to rotate by the electric motor.

Rotation of the pin assemblies causes the eccentric longitudinal protrusions at the second ends of the pin assemblies to move closer to, or further away from, a centre of the chuck.

When a wafer-shaped article is positioned on the chuck, rotating the pin assemblies so as to cause the eccentric longitudinal protrusions to move closer to the centre of the chuck causes the eccentric longitudinal protrusions to contact the outer edge of the wafer-shaped article, to thereby grip the outer edge of the wafer-shaped article and laterally restrain the wafer-shaped article.

Typically, a processing operation performed on the wafer-shaped article includes processing the wafer-shaped article using one or more processing liquids. For example, wet processing of semiconductor wafers may involve etching a surface of the semiconductor wafer using hydrofluoric acid (HF acid).

The main body of the pin assemblies is typically made from a bulk material that is relatively inert to the corrosive chemicals used in the processing operation. For example, the main body of the pin assemblies may be made from a plastic such as polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), or ethylene chlorotrifluoroethylene (ECTFE).

However, other components of the chuck body may be made of materials that are more likely to be damaged by the chemicals used in the processing operation, such as metal.

It is known to provide the pin assemblies with a circumferential groove around the main body of the pin assembly at a position inside the respective hole. Furthermore, a passage is provided in the chuck body to output a flow of a gas from the circumferential groove. In particular, a gas used in the processing operation, for example Nitrogen gas, can infiltrate between the pin assembly and the hole to the location of the circumferential groove. This gas can then be output from the circumferential groove, and therefore from the hole, via the passage in the chuck body.

This flow of gas can act to capture processing chemicals that infiltrate into the hole, and carry the captured processing chemicals through the passage away from the hole, so that the processing chemicals do not infiltrate further into the chuck body through the hole.

SUMMARY OF THE INVENTION

The present inventors have realised that the known arrangement discussed above can be insufficient to prevent infiltration of processing chemicals into the chuck body in some circumstances.

For example, when the processing operation involves elevated temperatures, or a long time period for the processing operation, the present inventors have found that processing chemicals can infiltrate into the hole past the circumferential groove and Nitrogen gas flow, and therefore infiltrate further into the chuck body.

For example, where the chuck body includes the second gear described above, for driving simultaneous rotation of the pin assemblies via the first gears discussed above, processing chemicals such as HF acid can infiltrate along the holes to the position of the second gear and cause corrosion of the second gear, which is typically made of metal.

Such corrosion can shorten the operational lifespan of the apparatus, and may cause performance or reliability problems such as sticking of the pin assemblies.

The present invention aims to restrict infiltration of a processing liquid used in a processing operation into a hole in which a pin assembly is partly positioned.

Such a problem is not unique to processing of semiconductor wafers, and instead the same problem can occur when treating surfaces of other materials, for example glass masters and mother panels used in manufacturing optical disks and LCD display panels, as well as for cleaning surfaces of processing chambers used during processing of the above-described substrates.

Furthermore, such a problem is not unique to the specific arrangement described above in which the pin assemblies are rotatable via the specific arrangement of the first and second gears described above. Instead, the same problem may occur with pin assemblies that are rotatable using a different rotation mechanism.

Therefore, at its most general, the present invention relates to an apparatus for processing wafer-shaped articles that has a support including a plurality of rotatable gripping pin assemblies, wherein the plurality of rotatable gripping pin assemblies protrude from respective holes in the support, and wherein a sealing member is positioned between at least one of the gripping pin assemblies and the respective hole.

According to a first aspect of the present invention, there is provided an apparatus for processing a wafer-shaped article, the apparatus comprising a support configured to support the wafer-shaped article during a processing operation to be performed on the wafer-shaped article; wherein:

the support comprises a support body and a plurality of gripping pin assemblies adapted and positioned relative to the support body for gripping the wafer-shaped article, wherein each of the gripping pin assemblies is rotatable relative to the support body between a gripping configuration in which the gripping pin assemblies grip the wafer-shaped article, and a non-gripping configuration in which the gripping pin assemblies do not grip the wafer-shaped article;

each of the gripping pin assemblies protrudes from a respective hole in the support body; and a sealing member is positioned between at least one of the gripping pin assemblies and the respective hole, the sealing member being configured to restrict infiltration of a processing liquid used in the processing operation into the hole.

In the present invention, the sealing member is positioned between the gripping pin assembly and the hole, and restricts infiltration of a processing liquid used in the processing operation into the hole. Therefore, the processing liquid is restricted (for example prevented, or substantially prevented) from penetrating into the hole beyond the sealing member.

Therefore, other components in the support body are protected from coming into contact with the processing liquid, and are therefore protected from undesirable chemical reactions such as corrosion.

The first aspect of the present invention may have any one, or, to the extent they are compatible, any combination of the following optional features.

The wafer-shaped article may be a semiconductor wafer.

Being wafer-shaped may mean that the article has a circular disc shape.

Processing of the wafer-shaped article may comprise etching of the wafer-shaped article, for example etching of a semiconductor wafer using HF acid.

The support may comprise a chuck.

The chuck may be a rotatable chuck, for rotating the wafer-shaped article supported by the chuck.

The support supporting the wafer-shaped article may mean holding the wafer-shaped article, gripping the wafer-shaped article, restraining movement of the wafer-shaped article, constraining movement of the wafer-shaped article, and/or contacting the wafer-shaped article.

For example, supporting the wafer-shaped article may comprise restraining or preventing lateral movement of the wafer-shaped article.

The gripping pin assemblies may grip the wafer-shaped article from a side or edge of the wafer-shaped article (i.e. from a circumferential edge), and/or from below (i.e. from a main surface) of the wafer-shaped article. By gripping the wafer-shaped article from the side or edge of the wafer-shaped article, the gripping pin assemblies may restrain or prevent lateral movement of the wafer-shaped article.

The support may maintain the wafer-shaped article in a predetermined orientation during the processing operation. For example, the support may restrict movement of the wafer-shaped article. The gripping pin assemblies may alternatively be referred to as gripping pins.

The holes in the support body may instead be referred to as bores, or channels, or openings, or passages.

At its most general, a gripping pin assembly may mean any part, for example an elongate part, that at least partly protrudes from the support body for gripping the wafer-shaped article, and that is rotatable relative to the support body.

The support body may have any suitable shape or configuration.

Each of the gripping pin assemblies protruding from a respective hole in the support body means that at least part of the gripping pin assembly is positioned in the hole, and at least part of the gripping pin assembly is positioned outside of the hole, so that the gripping pin assemblies extend beyond a surface of the support body.

The sealing member being positioned between the gripping pin assembly and the hole means that the sealing member is located in the hole between an outer surface of the gripping pin assembly and an inner surface of the hole.

A plurality of sealing members may be provided, so that respective sealing members are positioned between more than one of the gripping pin assemblies and the respective hole. For example, a respective sealing member may be positioned between each of the gripping pin assemblies and the respective hole. However, it is not essential for a sealing member to be provided between every gripping pin assembly and the respective hole, although this may be preferred.

The sealing member is any part or element that is provided between the gripping pin assembly and the hole and acts to restrict infiltration of a processing liquid used in the processing operation into the hole. Typically, the sealing member is an insert that is inserted into the hole.

The sealing member is generally a separate part to the gripping pin assembly and the hole.

In practice, the sealing member will fill some or all of a space between the gripping pin assembly and the hole.

In practice, the sealing member will contact both the gripping pin assembly and the hole.

Restricting infiltration of the processing liquid into the hole may mean reducing the amount of the infiltration, or preventing any infiltration.

The gripping pin assemblies being rotatable relative to the support body means that each of the gripping pin assemblies can be rotated around a respective longitudinal axis of the gripping pin assembly.

The gripping pin assemblies may be independently rotatable relative to the support body. Alternatively, the gripping pin assemblies may be rotatable in synchronisation relative to the support body.

The support body may comprise a rotation mechanism for driving rotation of the gripping pin assemblies relative to the support body.

The sealing member may surround a circumference (or perimeter) of the gripping pin assembly. Therefore, the sealing member may effectively restrict infiltration of the processing liquid.

Typically, a main body of the gripping pin assembly has a circular cross-section.

The sealing member may be ring-shaped, or have an annular shape.

The sealing member may be an O-ring.

The sealing member may be seated in a groove, or otherwise restrained, to restrict the sealing member from moving along the hole.

For example, the gripping pin assembly may have a circumferential grove around its outer surface, and the sealing member may be seated in the circumferential groove.

Alternatively, or in addition, a circumferential groove may be provided in the inner surface of the hole, and the sealing member may be seated in the circumferential groove.

Preferably, the sealing member comprises a material that is chemically inert with respect to the processing chemicals used in the processing operation. For example, the sealing member may comprise a perfluoroelastomer polymer. Such a material is substantially chemically inert with regards to HF acid, for example. However, other materials may be used instead.

Preferably the sealing member comprises a material that is elastically deformable, so that the sealing member provides a good seal between the gripping pin assembly and the hole.

Preferably the sealing member comprises an elastomeric material.

For example, the sealing member may comprise the specific material CHEMRAZ® 551, or a similar material.

The sealing member may be configured to rotate with the gripping pin assembly relative to the hole. Therefore, the sealing member may not rotate relative to the gripping pin assembly.

The sealing member may comprise an outer layer that reduces a sticking force between the sealing member and the hole, or that reduces a sticking force between the sealing member and the gripping pin assembly.

In other words, the sealing member may comprise an inner core formed of a first material and an outer layer formed of a second material, the second material providing a reduced sticking force between the sealing member and the hole or between the sealing member and the gripping pin assembly than would be provided by the first material.

Put another way, the sealing member may comprise an inner sealing body, and an outer layer that reduces a sticking force between the sealing member and the hole, or the sticking force between the sealing member and the gripping pin assembly.

The material of the outer layer (the second material) may be a harder material than the material of the inner sealing body (the first material).

The material of the outer layer may be a lower wear material than the material of the inner sealing body.

The outer layer may comprise a fluoropolymer based material that is different to a material of the inner sealing body.

The outer layer may comprise a PTFE based material. The outer layer may comprise PTFE.

The outer layer may be a coating layer that is coated over the inner sealing body.

The material of the outer layer may be an ENDURO™ LF10 coating, or a similar material.

A main body of the gripping pin assembly may be made from a plastic such as polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), or ethylene chlorotrifluoroethylene (ECTFE).

Each of the gripping pin assemblies may have a first gear that is located inside the support body, and the support body may include a driving mechanism for driving rotation of the first gear so as to rotate the gripping pin assembly.

The first gear may be located at a first end of the gripping pin assembly.

The first gear may be integral to a main body of the gripping pin assembly, and may be made of a same material as the main body of the gripping pin assembly.

The driving mechanism may comprise an electric motor that is coupled to the first gears in order to drive rotation of the first gears, either individually or in synchronisation.

The driving mechanism may comprise components that can be negatively affected by the processing chemicals, for example metal components that can be corroded by the processing chemicals.

The driving mechanism may comprise a second gear that is meshed with each of the first gears, so that rotation of the second gear causes synchronised rotation of each of the first gears.

The second gear may be formed of metal.

Each of the gripping pin assemblies may comprise a circumferential groove, and the support body may comprise a respective channel for outputting a flow of gas from the circumferential groove.

The gas is a gas used during the processing operation.

The gas may be nitrogen gas.

Where the gripping pin assembly includes a first circumferential groove for seating the sealing member, the circumferential groove from which the flow of gas is output is a second circumferential groove that is separate to the first circumferential groove.

The second circumferential groove is located further from the first end of the gripping pin assembly than the first circumferential groove.

Prevention of infiltration of the processing liquid into the hole may therefore be effectively achieved by the combination of the circumferential groove from which the flow of gas is output, and the sealing member that restricts infiltration of the processing liquid. However, it is not essential to also provide the second circumferential groove.

Each of the gripping pin assemblies may comprise:
a body;
a first gear; and
a gripping part at a second end of the body for gripping the wafer-shaped article.

The gripping part may comprise a longitudinal protrusion from a second end of the body, the longitudinal protrusion being spaced apart from a longitudinal axis of the gripping pin assembly.

In other words, the longitudinal protrusion may be an eccentric protrusion.

The second end of the body is an end that protrudes out of the hole.

The first gear may be provided at a first end of the body.

A surface of the second end of the body other than the longitudinal protrusion may be a support surface for contacting an underside of the wafer-shaped article so as to support the wafer-shaped article from beneath.

The support surface may be substantially flat.

each of the gripping pin assemblies may comprise a reinforcement member positioned in a recess formed in the gripping pin assembly.

For example, the recess may extend from the first end of the gripping pin assembly to the second end of the gripping pin assembly, or to a point between the first end and the second end.

In practice, the reinforcement member is an insert that is inserted into the recess.

The reinforcement member may have a greater strength than a material of the main body of the gripping pin assembly.

The reinforcement member may have a greater tensile strength than a material of the main body of the gripping pin assembly.

The reinforcement member may have a higher Young's modulus than a material of the main body of the gripping pin assembly.

Providing a reinforcement member may be advantageous because machining one or more circumferential grooves in the gripping pin assembly may reduce a strength or Young's modulus of the gripping pin assembly. This can be counteracted by providing the reinforcement member.

Advantageously, the reinforcement member is present in the gripping pin assembly at a longitudinal position of the gripping pin assembly where a circumferential groove is present. For example, where the sealing member is seated in a circumferential groove on the gripping pin assembly, advantageously the reinforcement member is present at the longitudinal position of the gripping pin assembly where the circumferential groove for the sealing member is located. This is advantageous because the strength or Young's modules of the gripping pin assembly may be a minimum where the circumferential groove is formed.

The reinforcement member may be made of metal material, for example.

The support may be a chuck surrounded by a process chamber for processing of semiconductor wafers. For example, the process chamber may be for wet processing of single semiconductor wafers.

The apparatus may further comprise a nozzle for dispensing processing liquid onto a surface of the wafer-shaped article support by the support. Typically, the liquid is dispensed onto a surface of the wafer-shaped article that is opposite to a surface of the wafer-shaped article that faces the support.

The apparatus may further comprise a heater for heating a surface of the wafer-shaped article. Typically the heater is arranged to heat the surface of the wafer-shaped article that faces the support.

The gripping pin assemblies may be positioned in a circular series surrounding an area where a wafer-shaped article is to be positioned on the support, and the gripping pin assemblies may be configured to make edge contact with the wafer-shaped article thereby to constrain it from lateral movement away from a pre-determined position.

According to a second aspect of the present invention there is provided a gripping pin assembly for use in an apparatus for processing a wafer-shaped article, the gripping pin assembly comprising:
  a body;
  a gear;
  a first circumferential groove around the body for seating a sealing member around the circumference of the body; and
  a second circumferential groove around the body.

The gripping pin assembly may be configured for, or suitable for, use in the apparatus according to the first aspect of the present invention, and may optionally have any of the features of the gripping pin assembly in the first aspect of the present invention described above.

The gear may be formed at a first end of the body.

The second circumferential groove may be further from the first end of the body than the first circumferential groove.

According to a third aspect of the present invention there is provided a gripping pin assembly for use in an apparatus for processing a wafer-shaped article, the gripping pin assembly comprising:
  a body;
  a gear;
  a first circumferential groove around the body; and
  a sealing member seated in the first circumferential groove.

The gear may be formed at a first end of the body.

The gripping pin assembly may be configured for, or suitable for, use in the apparatus according to the first aspect of the present invention, and may optionally have any of the features of the gripping pin assembly in the first aspect of the present invention described above.

The second aspect of the present invention and/or the third aspect of the present invention may have any, or, to the extent that they are compatible, any combination of the following optional features.

The gripping pin assembly may further comprise a reinforcement member positioned in a recess formed in the body.

The reinforcement member may extend from the first end of the body to a point at or beyond the first circumferential groove.

The gripping pin assembly may comprise a protrusion that protrudes longitudinally from a second end of the body, the protrusion being spaced apart from a longitudinal axis of the gripping pin assembly.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1:
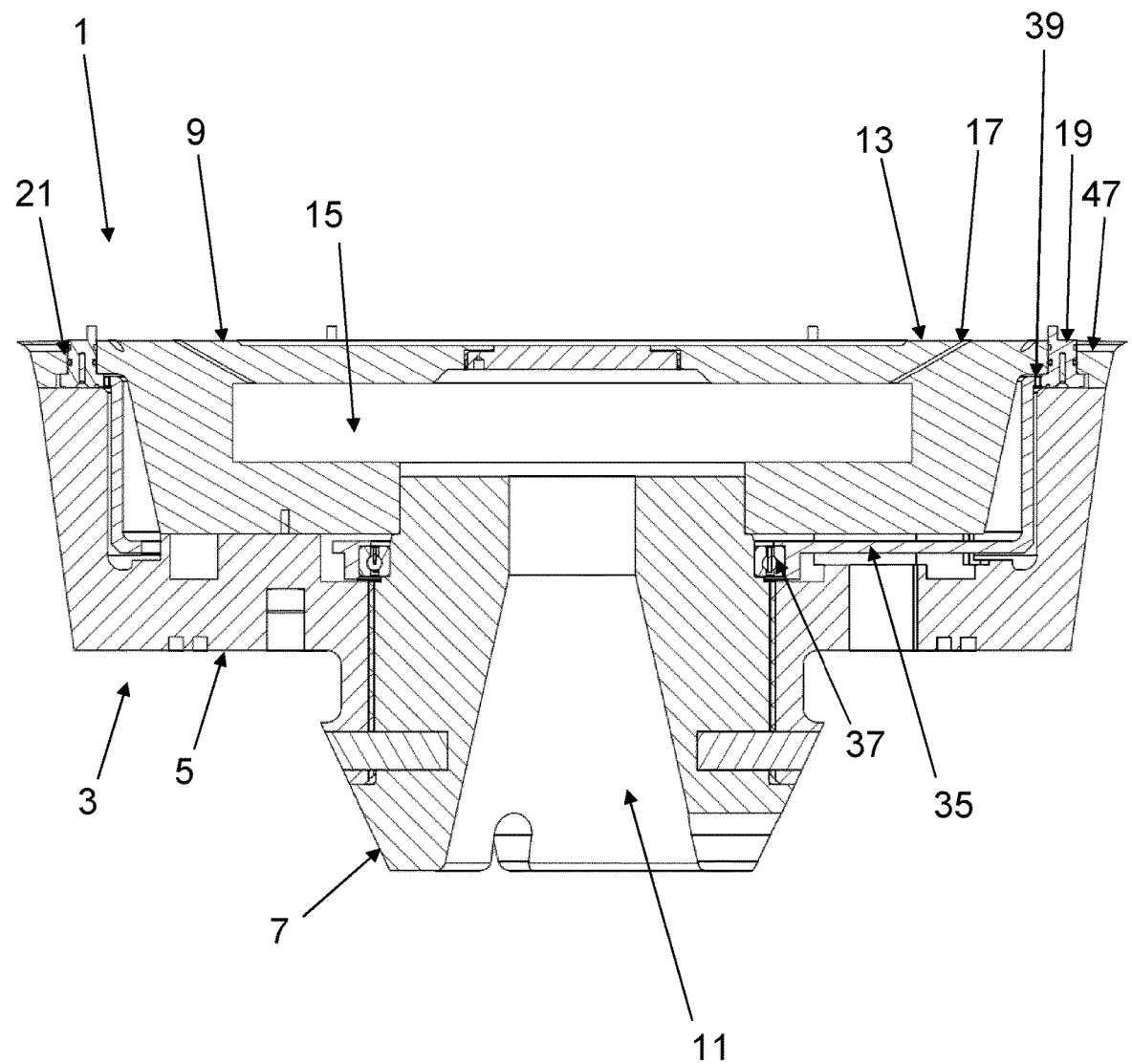
FIG. 1 is a sectional view of a chuck for an apparatus for processing semiconductor wafers according to an embodiment of the present invention.

FIG. 1 is a partial sectional view of a chuck 1 for an apparatus for processing semiconductor wafers according to an embodiment of the present invention.

In use, the chuck 1 may be surrounded, or partially surrounded, by a process chamber for single wafer wet processing of semiconductor wafers. The process chamber can have any suitable configuration.

As shown in FIG. 1, the chuck 1 comprises a chuck body 3 that comprises a generally cup-shaped base part 5, a spindle receiving part 7 surrounded by the cup-shaped base part 5, and an upper part 9.

The chuck 1 is intended to be mounted on a spindle by the spindle being inserted into a recess 11 formed in the spindle receiving part 7. The recess 11 is shaped to operatively engage with the spindle by having a shape that corresponds to the shape of the spindle. In this embodiment, the recess 11 has a frustoconical shape that corresponds to a complementary frustoconical shaped spindle.

Of course, in other embodiments the construction of the chuck may be different to that described above. For example, the chuck may instead be formed as a single piece, or from fewer or more components than those illustrated in FIG. 1.

The chuck 1 can therefore be rotated relative to the process chamber using the spindle. The chuck 1 may therefore be referred to as a "spin chuck".

The upper part 9 and the base part 5 are fixed together, for example using screws.

The upper part 9 has an upper surface 13 for supporting a semiconductor wafer. In particular, the upper surface 13 is for contacting a lower surface of a semiconductor wafer, so as to support the semiconductor wafer from beneath.

As shown in FIG. 1, the upper part 9 of the chuck body 3 encloses a gas distribution chamber 15. The gas distribution chamber 15 is adjacent to a top end of the recess 11 in the spindle receiving part 7, such that when a suitably shaped spindle is received into the recess 11, a top end of the spindle extends into the gas distribution chamber 15 in the upper part 9.

The spindle is preferably hollow and includes a plurality of radially directed through-holes at its distal end. Thus, pressurised gas, such as Nitrogen gas, delivered through the hollow spindle may be directed through these through-holes into the gas distribution chamber 15.

The upper part 9 of the chuck body 3 further includes an annularly arranged plurality of holes 17 extending from the gas distribution chamber 15 to the upper surface 13 of the upper part 9. Accordingly, gas may be delivered through the hollow spindle, the gas distribution chamber 15 and the holes 17 such that a wafer, when present, may be floated on a gas cushion during processing. Such gas may also be used to aid in securing a wafer to the chuck 1 operating on the Bernoulli principle.

However, the supply of gas to the upper surface 13 is not essential, and therefore may be omitted in other embodiments. For example, it is not essential for the chuck to include the gas distribution chamber 15 and holes 17, and in other embodiments the gas distribution chamber 15 and holes 17 may be omitted.

Figure 2:
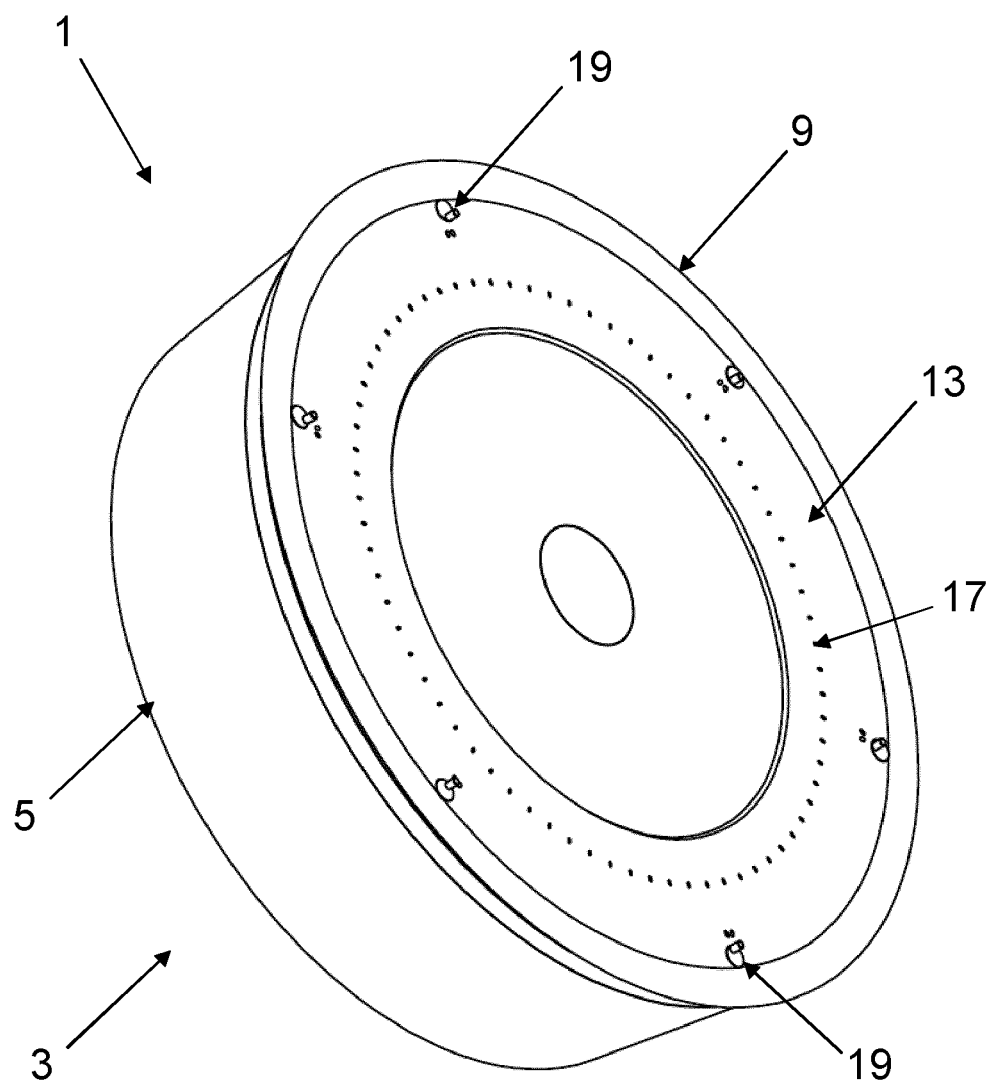
FIG. 2 is a perspective view of the chuck of FIG. 1.

As shown in FIGS. 1 and 2, the chuck 3 further includes a plurality of pin assemblies 19. As shown in FIG. 2, the plurality of pin assemblies 19 are positioned in a circular series surrounding an area where a wafer-shaped article is to be positioned on the upper surface 13 of the upper part 9.

As shown in FIG. 1, each of the pin assemblies 19 is partly (mostly) positioned in a respective hole 21 in the upper part 9 of the chuck body 3. Specifically, each of the pin assemblies 19 is received in a respective hole 21 in the upper part 9 of the chuck body 3 with a part of the pin assembly 19 protruding out of the hole 21 beyond the upper surface 13 of the upper part 9.

In this embodiment, the holes 21 are cylindrical holes that are bored into the upper part 9 of the chuck body 3.

Figure 3A:
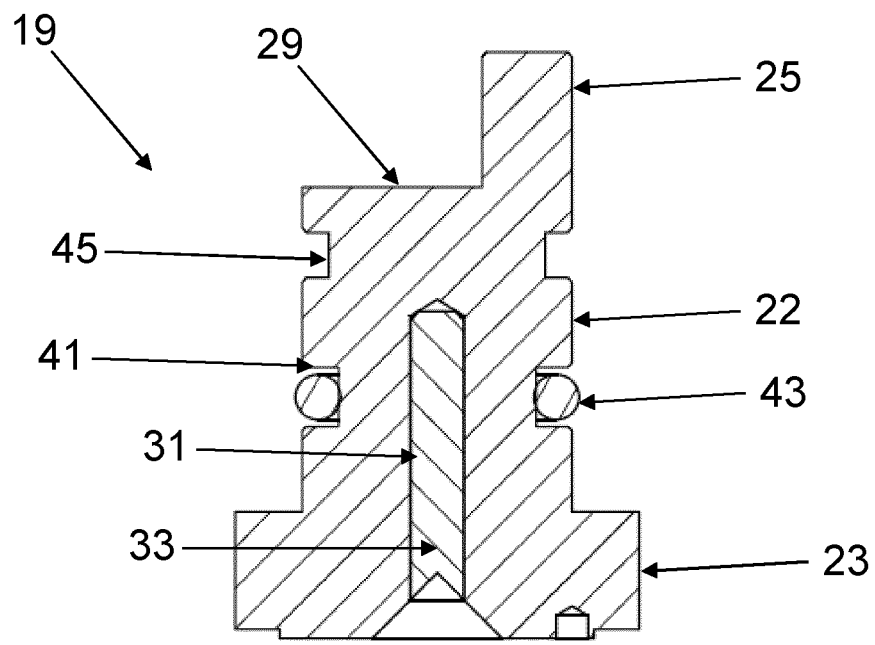
FIG. 3A is a sectional view of a pin assembly according to an embodiment of the present invention, for use in the chuck of FIGS. 1 and 2.
Figure 3B:
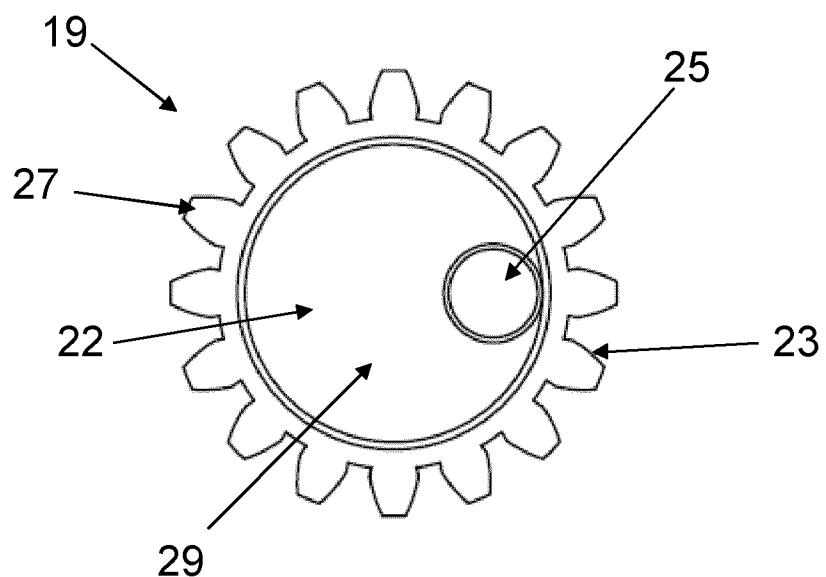
FIG. 3B is a plan view of the pin assembly of FIG. 3A.
Figure 3C:
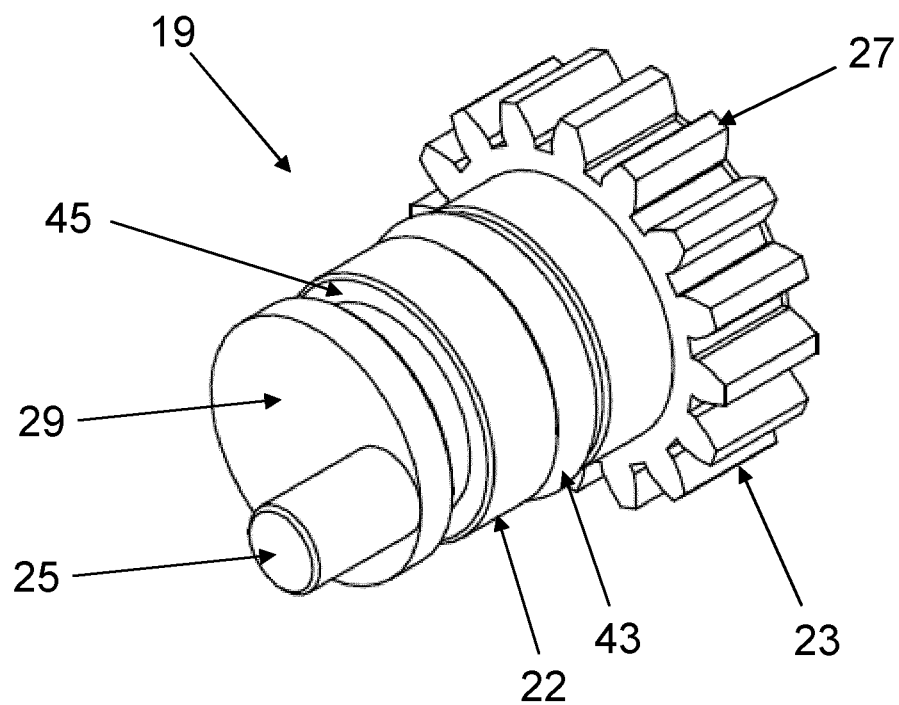
FIG. 3C is a perspective view of the pin assembly of FIG. 3A.

The configuration of the pin assemblies 19 in an embodiment of the present invention is illustrated in FIGS. 3A to 3C.

As shown in FIG. 3A, each of the pin assemblies 19 comprises a main body part 22 that is substantially cylindrical in shape, a gear 23 provided at a first end of the main body part 22, and a longitudinal protrusion 25 provided at a second end of the main body part.

The gear 23 comprises a plurality of gear teeth 27 that extend radially outwards from the first end of the main body part 22.

In this embodiment, the gear 23 is integrally formed with the main body part 22. In other words, the gear 23 is formed as one piece with the main body part 22, from the same material as the main body part 22. However, in other embodiments the gear 23 may be formed separately to the main body part 22 and then attached to the main body part 22, and may be formed of a different material to the main body part 22.

The longitudinal protrusion 25 is integrally formed with the main body part 22. In other words, the longitudinal protrusion 25 is formed as one piece with the main body part 22, from the same material. However, in other embodiments the longitudinal protrusion 25 may be formed separately to the main body part 22 and then attached to the main body part 22, and may be formed of a different material to the main body part 22.

The main body part 22 (and optionally also the longitudinal protrusion and/or the gear) of the pin assemblies 19 may be made from a plastic such as polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), or ethylene chlorotrifluoroethylene (ECTFE).

The longitudinal protrusion 25 in this embodiment is cylindrical in shape. However, this is not essential.

The longitudinal protrusion 25 extends longitudinally from a top surface 29 of the main body 22. This top surface 29 is substantially flat, apart from the longitudinal protrusion 25.

The longitudinal protrusion 25 is narrower (has a smaller diameter) than the main body 22 and is positioned off-centre relative to the main body 22. The longitudinal protrusion 25 is therefore spaced apart from a longitudinal axis of the main body 22. In other words, the longitudinal protrusion 25 is an eccentric protrusion.

As shown in FIG. 3A, a recess 31 is formed in a bottom surface of the main body 22. For example, the recess 31 may be a bore that is drilled into the bottom surface of the main body 22, or otherwise formed in the bottom surface of the main body 22.

An insert 33 is positioned in the recess 31. For example, the insert 33 may be inserted into the recess 31 from the bottom surface of the main body 22.

The insert 33 has a higher strength and/or Young's modulus than the main body 22. The insert 33 therefore acts as a reinforcement member that increases the strength and/or stiffness of the main body 22.

The insert 33 may be made of metal, for example titanium.

As shown in FIGS. 1 and 2, each of the plurality of pin assemblies 19 is received in the respective hole 21 in the upper part 9 of the chuck body 3 so that top surface 29 of the main body 22 of the pin assembly 19 is flush or substantially flush with a surrounding surface of the upper part 9, so that only the longitudinal protrusion 25 protrudes from the hole 21 above the upper surface 13 of the upper part 9.

The top surface 29 of the main body of the pin assembly 19 can therefore contact an underside of a semiconductor wafer received on the upper surface 13 of the upper part 9.

As shown in FIG. 1, the chuck body 3 comprises a rotation mechanism for driving rotation of the gears 23 of the pin assemblies 19, so as to rotate the pin assemblies 19.

In particular, the chuck body 3 includes a second gear 35 that is rotatably mounted in the chuck body via bearings 37 in the chuck body 3. The second gear 35 can therefore be rotated within the chuck body 3 relative to the chuck body 3.

The second gear 35 includes a gear rim 39 that is coupled (meshed) to the gears 23 of each of the pin assemblies 19. Therefore, rotation of the second gear 35 causes simultaneous rotation of the gears 23 of each of the pin assemblies 19, and therefore simultaneous rotation of each of the pin assemblies 19.

A driving means, for example an electric motor, is coupled to the second gear 35 to drive rotation of the second gear 35.

As can be understood from FIG. 1, for example, rotation of a pin assembly 19 will cause the longitudinal protrusion 25 to move closer to, or further away from, a centre of the upper surface 13 of the upper part 9 of the chuck body 3, depending on the rotational position of the longitudinal protrusion 25.

The pin assemblies 19 are arranged so that their longitudinal protrusions 25 move in synchronisation as the pin assemblies 19 are rotated by the second gear 35. In other words, a distance from each of the longitudinal protrusions 25 to the centre of the upper surface 13 is the same for all of the pin assemblies 19 as the pin assemblies 19 rotate.

The pin assemblies 19 are rotatable relative to the chuck body 3 between a gripping configuration in which the pin assemblies 19 can grip a semiconductor wafer positioned on the upper surface 13, and a non-gripping configuration in which the pin assemblies 19 do not grip the semiconductor wafer.

In particular, in the gripping configuration the pin assemblies 19 are rotated so that the longitudinal protrusions 25 contact an outer edge of the semiconductor wafer and apply pressure to the semiconductor wafer. The circular arrangement of the pin assemblies 19 means that the longitudinal protrusions therefore grip and hold the semiconductor wafer, preventing lateral movement of the semiconductor wafer. In the non-gripping configuration, the pin assemblies 19 are rotated so that the longitudinal protrusions 25 do not contact the outer edge of the semiconductor wafer, such that the semiconductor wafer is not laterally constrained.

The apparatus typically includes a nozzle for dispensing a processing liquid onto a surface of the semiconductor wafer. Typically, the processing liquid is dispensed onto an opposite surface of the semiconductor wafer to a surface of the semiconductor wafer that faces the chuck body 3. For example, the processing liquid may be HF acid that is used to etch a surface of the semiconductor wafer.

As the chuck 1 is spun during the processing operation, processing liquid that is dispensed onto the surface of the semiconductor wafer will move radially outwards across the surface of the semiconductor wafer, towards the edge of the semiconductor wafer. Some of the processing liquid will therefore come into contact with the pin assemblies 19 that are positioned around the periphery of the semiconductor wafer.

Since the fit between the pin assemblies 19 and the holes 21 is not an interference fit, to allow rotation of the pin assemblies 19 relative to the holes 21, some of the processing liquid will infiltrate into the holes 21 between the outer surface of the pin assembly 19 and the inner surface of the hole 21.

The second gear 35 is made of metal which may be subject to corrosion if it comes into contact with processing liquid such as HF. Therefore, it is desirable to prevent the processing liquid from reaching the second gear 35.

In order to achieve this, as shown in FIG. 3A, a first circumferential groove 41 is provided around the circumference of the main body 22 of the pin assembly 19.

An O-ring 43 is seated in the first circumferential groove 41 around the circumference of the main body 22.

A width or thickness of the O-ring 43 is greater than a depth of the first circumferential groove 41, so that part of the O-ring 43 extends radially outwards from the first circumferential groove 41 beyond an outer surface of the main body 22 adjacent to the first circumferential groove 41.

The O-ring 43 in this embodiment comprises a perfluoroelastomer material that is coated with a PTFE based coating. More specifically, the O-ring 43 in this embodiment comprises an O-ring formed of CHEMRAZ® 551 that is coated with an ENDURO® LF10 coating.

More generally, a suitable O-ring 43 comprises an elastomer material that is coated with a material providing a lower sticking force with the inner surface of the hole 21 than would be provided by the elastomer material. The elastomer material therefore provides a suitable seal between the pin assembly 19 and the hole 21, whereas the coating material minimises friction between the O-ring 43 and the hole 21, so that the pin assembly 19 can be controllably rotated within the hole 21 without sticking.

The O-ring 43 is fitted around the circumference of the main body 22 inside the first circumferential groove 41, such that the O-ring 43 grips the main body 22. The O-ring 43 therefore rotates together with the main body 22.

When the pin assembly 19 is positioned in the respective hole 21, as illustrated in FIG. 1, the O-ring 43 contacts an inner surface of the hole 21 and is compressed by the inner surface of the hole 21.

The O-ring 43 therefore provides a seal between the pin assembly 19 and the hole 21 that extends all the way around the circumference of the pin assembly 19, thereby preventing processing liquid from penetrating further into the hole 21 than the position of the O-ring 43. Processing liquid is therefore prevented from reaching the second gear 35.

As mentioned above, the elastomer material in the O-ring 43 ensures there is a good seal between the O-ring 43, the main body 22 and the inner surface of the hole 21, so that infiltration of processing liquid into the hole 21 beyond the position of the O-ring 43 is prevented or substantially prevented.

However, an O-ring 43 made of purely elastomeric material may provide a high sticking force between the O-ring 43 and the inner surface of the hole 21, such that it is difficult to controllable rotate the pin assemblies 19. Therefore, it is preferable for the O-ring 43 to include the coating material that minimises friction between the O-ring 43 and the hole 21, so that the pin assembly 19 can be controllably rotated within the hole 21 without sticking.

Providing the first circumferential groove 41 may reduce a strength and/or Young's modulus of the main body 22 of the pin assembly 19. Therefore, as shown in FIG. 3A, it is advantageous for the insert 33 to extend to at least the position of the first circumferential groove 41, and preferably to a position beyond the position of the first circumferential groove 41. The insert 33 can there reinforce the main body 22 at the position where the main body 22 is weakened by the first circumferential groove 41.

As shown in FIGS. 3A and 3C, a second circumferential groove 45 is also provided around the circumference of the main body 22 of the pin assembly 19. The second circumferential groove 45 is further from the first end of the main body 22 than the first circumferential groove 41. Put another way, the second circumferential groove 45 is closer to the longitudinal protrusion 25 than the first circumferential groove 41.

As shown in FIG. 1, the upper part 9 of the chuck body 3 includes passageways 47 that are arranged so that when the pin assemblies 19 are arranged in the holes 21, the passageways 47 are communicated (in fluid communication, i.e. gas communication) with the second circumferential grooves 45 of the pin assemblies 19.

More specifically, the passageways 47 extend from the holes 21 to an outside of the chuck body 3.

As mentioned above, gas is supplied to a space beneath a semiconductor wafer from the gas supply chamber 15 and the plurality of holes 17. A gas pressure above the upper part 9 of the chuck body 3 may therefore be greater than a gas pressure around the sides of the chuck body 3. This pressure difference may cause a flow of gas from above the upper part 9 of the chuck body 3, into the holes 21, to the second circumferential groove 45 of the pin assemblies 19, and through the passageways 47 to the outside of the chuck body 3.

Some of the processing fluid that infiltrates into the holes 21 may be collected in the second circumferential grooves 45 and then carried out of the holes 21 through the passageways 47 by the flow of the gas.

Therefore, infiltration of processing liquid into the holes 21 may also be restricted by the gas flow through the second circumferential grooves 45 of the pin assemblies 19.

In an alternative embodiment, the O-ring 43 may instead be seated in a circumferential groove formed on an inner surface of the hole, and may not rotate relative to the hole. Therefore, the pin assembly 19 may rotate within the hole relative to the O-ring 43.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. An apparatus for processing a wafer-shaped article, the apparatus comprising a support configured to support the wafer-shaped article during a processing operation to be performed on the wafer-shaped article; wherein:
   the support comprises a support body and a plurality of gripping pin assemblies adapted and positioned relative to the support body for gripping the wafer-shaped article, wherein each of the gripping pin assemblies is rotatable relative to the support body between a gripping configuration in which the plurality of gripping pin assemblies grip the wafer-shaped article, and a non-gripping configuration in which the plurality of gripping pin assemblies do not grip the wafer-shaped article;
   each of the plurality of gripping pin assemblies protrudes from a respective hole in the support body;
   a sealing member is positioned between at least one of the plurality of gripping pin assemblies and the respective hole, the sealing member being configured to restrict infiltration of a processing liquid used in the processing operation into the hole;
   the sealing member comprises an inner sealing body, and an outer layer that reduces a sticking force between the sealing member and the hole, or the sticking force between the sealing member and the at least one of the plurality of gripping pin assemblies; and
   each of the at least one of the plurality of gripping pin assemblies comprises
      a body,
      a first circumferential groove formed in and extending around the body in which the sealing member is seated around a circumference of the body, and
      a second circumferential groove formed in and extending around the body.

2. The apparatus according to claim 1, wherein the sealing member comprises an O-ring.

3. The apparatus according to claim 1, wherein the sealing member comprises a perfluoroelastomer polymer.

4. The apparatus according to claim 1, wherein the sealing member is configured to rotate with the at least one of the plurality of gripping pin assemblies relative to the hole.

5. The apparatus according to claim 1, wherein the outer layer is a fluoropolymer (e.g. PTFE) based outer layer, different than material of the inner sealing body.

6. The apparatus according to claim 1, wherein each of the plurality of gripping pin assemblies has a first gear that is located inside the support body, and the support body includes a driving mechanism for driving rotation of the first gear so as to rotate that gripping pin assembly.

7. The apparatus according to claim 6, wherein the driving mechanism comprises a second gear that is meshed with each of the first gears, so that rotation of the second gear causes synchronised rotation of each of the first gears.

8. The apparatus according to claim 1, wherein the support body comprises a respective channel for outputting a flow of a gas from the second circumferential groove.

9. The apparatus according to claim 1, wherein each of the gripping pin assemblies comprises:
a first gear; and
a gripping part at a second end of the body for gripping the wafer-shaped article.

10. The apparatus according to claim 9, wherein the gripping part comprises a longitudinal protrusion from the second end of the body, the longitudinal protrusion being spaced apart from a longitudinal axis of the at least one of the plurality of gripping pin assemblies.

11. The apparatus according to claim 1, wherein each of the plurality of gripping pin assemblies comprises a reinforcement member positioned in a recess formed in that gripping pin assembly.

12. The apparatus according to claim 1, wherein the support is a chuck surrounded by a process chamber for processing of semiconductor wafers.

13. The apparatus according to claim 1, wherein the gripping pin assemblies are positioned in a circular series surrounding an area where the wafer-shaped article is to be positioned on the support, and the gripping pin assemblies are configured to make edge contact with the wafer-shaped article thereby to constrain it from lateral movement away from a pre-determined position.

14. A gripping pin assembly for use in an apparatus for processing a wafer-shaped article, the gripping pin assembly comprising:
a body;
a gear;
a first circumferential groove formed in and extending around the body for seating a sealing member around the circumference of the body; and
a second circumferential groove formed in and extending around the body.

15. A gripping pin assembly for use in an apparatus for processing a wafer-shaped article, the gripping pin assembly comprising:
a body;
a gear;
a first circumferential groove formed in and extending around the body;
a second circumferential groove formed in and extending around the body; and
a sealing member seated in the first circumferential groove.

16. The gripping pin assembly according to claim 14, wherein the gripping pin assembly further comprises a reinforcement member positioned in a recess formed in the body.

17. The gripping pin assembly according to claim 16, wherein the reinforcement member extends from a first end of the body to a point at or beyond the first circumferential groove.

18. The gripping pin assembly according to claim 14, wherein the gripping pin assembly comprises a protrusion that protrudes longitudinally from a second end of the body, the protrusion being spaced apart from a longitudinal axis of the gripping pin assembly.

* * * * *